United States Patent [19]

Sundaresan

[11] Patent Number: 5,016,070
[45] Date of Patent: May 14, 1991

[54] STACKED CMOS SRAM WITH VERTICAL TRANSISTORS AND CROSS-COUPLED CAPACITORS

[75] Inventor: Ravishankar Sundaresan, Garland, Tex.

[73] Assignee: Texas Instruments Incorporated, Dallas, Tex.

[21] Appl. No.: 548,446

[22] Filed: Jul. 5, 1990

Related U.S. Application Data

[63] Continuation of Ser. No. 373,746, Jun. 30, 1989, abandoned.

[51] Int. Cl.⁵ .................. H01L 29/68; H01L 29/10; H01L 27/01
[52] U.S. Cl. .................. 357/23.6; 357/23.4; 357/23.7; 357/41; 357/42; 357/49; 357/54; 357/55; 357/59
[58] Field of Search ............ 357/23.6, 23.4, 55, 357/23.7, 42, 51, 41, 49, 54, 59 E, 59 F, 59 G

[56] References Cited

U.S. PATENT DOCUMENTS

| | | | |
|---|---|---|---|
| 4,243,997 | 1/1981 | Natori et al. | 357/23.4 |
| 4,453,305 | 6/1984 | Janes et al. | 357/23.4 |
| 4,724,530 | 2/1988 | Dingwall | 357/42 |
| 4,771,323 | 9/1988 | Sasaki | 357/23.6 |
| 4,794,561 | 12/1988 | Hsu | 357/23.6 |

FOREIGN PATENT DOCUMENTS

| | | | |
|---|---|---|---|
| 0090395 | 5/1986 | Japan | 357/23.6 |
| 0050056 | 3/1988 | Japan | 357/23.6 |

Primary Examiner—Andrew J. James
Assistant Examiner—Ngan Van Ngo
Attorney, Agent, or Firm—James C. Kesterson; James T. Comfort; Melvin Sharp

[57] ABSTRACT

A transistor cell (80) and enabling transistor (118) are provided. The transistor cell includes a trench transistor and a stacked transistor, with a cross-coupled capacitor between the gates of these transistors. The trench transistor includes a semiconductor region (98) functioning as a gate and first and second diffused regions (126, 135) as the source/drain regions therefor. The stacked transistor has a semiconductor layer (104) functioning as the gate and first and second doped regions (112, 114) within a semiconductor layer (110) functioning as the source/drain regions therefor. The stacked capacitor included herewith comprises semiconductor layer (104) and semiconductor region (98) having insulating layers (96, 102) therebetween.

11 Claims, 3 Drawing Sheets

5,016,070

STACKED CMOS SRAM WITH VERTICAL TRANSISTORS AND CROSS-COUPLED CAPACITORS

This application is a continuation of application Ser. No. 373,746, filed June 30, 1989, now abandoned.

TECHNICAL FIELD OF THE INVENTION

This invention relates in general to transistor latch technology, and more particularly to a stacked CMOS transistor configuration having trench transistors with cross-coupled capacitors therein to form a latch circuit.

BACKGROUND OF THE INVENTION

As SRAM densities increase, it is becoming increasingly necessary to find alternative ways to obtain smaller SRAM cells. Stacked CMOS technology in which the P channel load is stacked on top of an N channel bulk transistor is being utilized for building 4 megabit memories and beyond. As the device geometry decreases, each cell therein becomes susceptible to soft radiation errors. As a result, it is imperative to utilize capacitors at the sensitive nodes to maintain charges which otherwise would be affected by exposure to soft radiation.

Under an existing stacked CMOS technology known as merged CMOS (MCMOS), a stacked CMOS latch is constructed with a single polysilicon layer overlying a bulk P type substrate. As a result, the source and drain regions of the underlying N channel transistor are not self-aligned to the gate electrode of the transistor. Further, the underlying bulk N channel transistor consumes Ca considerable amount of lateral area. Moreover, the gate oxide for both the N channel and P channel transistors comprises the same oxide layer and, as a result, must necessarily be of the same thickness for both transistors limiting the functionality of the transistors. Additionally, under the current art, there are no provisions for a stacked capacitor within the SRAM configuration.

Therefore, a need has arisen for a stacked CMOS cell which minimizes a real consumption and includes therein a stacked capacitive element to reduce susceptibility to soft radiation exposure. There also exists a need to provide independent gate oxides for the buried N channel transistor and overlying P channel transistor.

SUMMARY OF THE INVENTION

In accordance with the present invention, a transistor cell is provided which substantially eliminates or reduces disadvantages associated with prior transistor cell configurations.

The transistor cell of the present invention generally includes a trench transistor adjacent a stacked transistor. Further included within the present invention is a stacked capacitive element having first and second opposing plates, the first plate electrically coupled to the gate of the trench transistor and the second plate electrically coupled to the gate of the stacked transistor. In the preferred embodiment, the trench transistor is an N channel transistor while the stacked transistor is a P channel transistor. An enabling transistor may also be connected to either the input or output of the stacked configuration provided for herein.

The present invention provides the technical advantage of a configuration stacked over a base trench transistor, thereby minimizing cell dimensions and giving rise to larger packing densities. Further, the inclusion of capacitors within the cell provides the technical advantage of reduced cell susceptibility to soft radiation errors. Another technical advantage of the present invention includes independent gate oxides between the gates and the channels of each of the transistors therein. The independent gate oxides give rise to the technical advantages of increased gate oxide integrity and selective threshold voltages for each independent transistor. Further, there is the technical advantage of selective capacitance for the capacitive elements provided with the present invention.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

The preferred embodiment of the present invention is best understood by referring to FIGS. 1–5b of the drawings, like numerals being used for like and corresponding parts of the various drawings.

Figure 1:
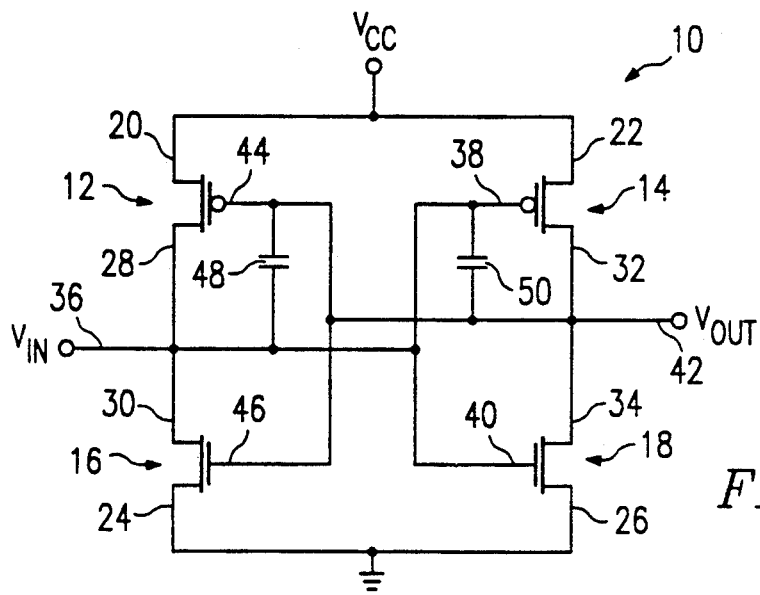
FIG. 1 illustrates a schematic of a latch memory cell having cross-coupled capacitors therein.

FIG. 1 illustrates a schematic view of a latch 10 giving rise to the present invention. Latch 10 comprises generally two pairs of MOS transistors. These transistors include a first and second P channel transistor 12 and 14, and a first and second N channel transistor 16 and 18, respectively. A first source/drain 20 and 22 of both P channel transistors 12 and 14, respectively, are connected to an uppermost supply voltage, $V_{cc}$. Similarly, a first source/drain 24 and 26 of N channel transistors 16 and 18 are connected to a lowermost reference voltage, which is typically ground. The second source/drain 28 of P channel transistor 12 and the second source/drain 30 of N channel transistor 16 are connected. Similarly, the second source/drains 32 and 34 of P channel transistor 14 and N channel transistor 18 are connected.

A digital information may be stored in first node 36 of latch 10. First node 36 is further connected to the gates 38 and 40 of P channel transistor 14 and N channel transistor 18, respectively, and to the second source/drain 28 and 30 of transistors 12 and 16. A second node 42 is connected to the gates 44 and 46 of P channel transistor 12 and N channel transistor 16, respectively. Second node 42 stores the converse of the digital information stored at first node 36. Additionally, second node 42 is connected to the second source/drains 32 and 34 of P channel transistor 14 and N channel transistor 18. The interconnection of P channel transistor 12 to N channel transistor 18, and the like connection of N channel transistor 16 to P channel transistor 14 is known in the art as "cross-coupling" of the transistor pairs. A first capacitor 48 is connected between gate 44 of P channel transistor 12 and first node 36. Similarly, a second capacitor 50 is connected between gate 38 of P channel transistor 14 and second node 42.

The operation of latch 10 may be appreciated by tracing an exemplary signal therethrough. For example, where $V_{IN}$ is a digital "1", P channel transistor 14 will be at a high impedance state while N channel transistor 18 will conduct. Accordingly, second node 42 will be connected to ground, thereby yielding a digital "0" as the output. In addition to representing the output signal, this digital "0" will be connected to gates 44 and 46 of P channel transistor 12 and N channel transistor 16. This digital "0" will cause P channel transistor 12 to conduct and N channel transistor 16 to be in a high impedance state. Accordingly, the uppermost supply voltage $V_{cc}$ will conduct to first node 36 and be returned to gates 38 and 40 of P channel transistor 14 and N channel transistor 18. Thus, it may be appreciated that latch 10 is constructed in a regenerative feedback configuration through the network of transistors therein. Accordingly, latch 10 will operate to generally maintain its present state so long as the uppermost voltage $V_{cc}$ remains active.

However, without the addition of capacitors 48 and 50, latch 10 is more susceptible to soft radiation signals. In other words, soft radiation may cause the action of the transistors within latch 10 to fluctuate thereby affecting the otherwise valid signals thereon. Accordingly, capacitors 48 and 50 operate to store the signals within the circuit during any brief time periods where radiation may otherwise have a deleterious effect thereon.

Figure 2:
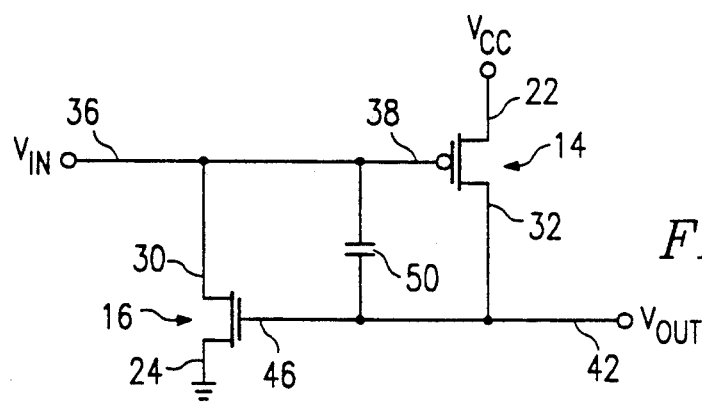
FIG. 2 illustrates a schematic of one pair of the cross-coupled P and N channel transistors of FIG. 1 having a capacitor connected between the gates of both transistors.

FIG. 2 illustrates a schematic view of one of the cross-coupled pairs of transistors of FIG. 1. More particularly, second P channel transistor 14 and first N channel transistor 16 are shown. Similarly, the other common reference numerals from FIG. 1 are shown. The present invention provides a method and particular structure for constructing the schematic of FIG. 2 in a stacked MOS transistor configuration. It is to be understood, however, that first P channel transistor 12 and second N channel transistor 18 may be similarly constructed in the same form as that to be discussed hereinafter. Once each pair of transistors are constructed, they may be interconnected as is necessary according to the schematic of FIG. 1.

Figure 3:
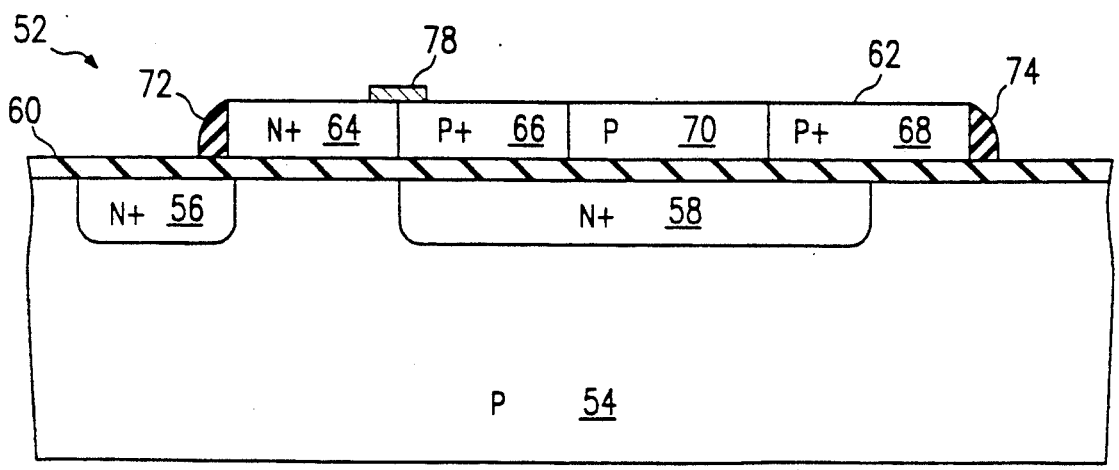
FIG. 3 illustrates a cross-sectional view of a prior art stacked CMOS configuration.

FIG. 3 illustrates a prior art stacked CMOS configuration 52 for effecting the schematic of FIG. 2 without the addition of capacitor 50 as illustrated therein. CMOS configuration 52 includes a semiconductor substrate 54 which is typically formed of a P type semiconductor material. First and second diffused regions 56 and 58, respectively, are formed within semiconductor substrate 54. Both regions 56 and 58 are typically of an N type semiconductor material. More particularly, these regions are doped to an "N+" level, thereby denoting a high dopant concentration on the order of $10^{21}/cm^3$. An insulating layer 60 is formed overlying semiconductor substrate 54. Thereafter, a polysilicon layer 62 is formed above insulating layer 60. Polysilicon layer 62 is masked and doped to include four different regions 64, 66, 68 and 70 therein. A first doped region 64 may be of an N type doping at a high doping level similar to that of diffused regions 56 and 58. A second and a third doped region 66 and 68 are doped with a P type dopant and are also of a high doping concentration level. A fourth doped region 70 is formed between second and third doped regions 66 and 68. Fourth doped region 70 may be of either a P or N type material, but is typically made of a P type material such that the threshold voltage between doped regions 66 and 68 is relatively low. Insulating sidewalls 72 and 74 are formed at the ends of polysilicon layer 62. A conductive strap 78 electrically couples first doped region 64 to second doped region 66.

The correlation of the various regions within FIG. 3 and the schematic of FIG. 2 is as follows. First and second diffused regions 56 and 58 correspond to the first source/drain 24 and second source/drain 30, respectively, of first N channel transistor 16. Thus, first diffused region 56 will be connected to ground in accordance with FIG. 2. First doped region 64 functions as the gate 46 for first N channel transistor 16. Second doped region 66 and third doped region 68 act as the second source/drain 32 and first source/drain 22, respectively, of second P channel transistor 14. Thus, third doped region 68 will be connected to $V_{cc}$ in accordance with FIG. 2. Further, conductive strap 78 connects gate 46 of N channel transistor 16 to second source/drain 32 of P channel transistor 14. Fourth doped region 70 functions as the channel region for P channel transistor 14. Second diffused region 58 functions as the gate 38 for P channel transistor 14. Therefore, second diffused region 58 functions as both the gate 38 for P channel transistor 14 and the second source/drain 30 of N channel transistor 16. It should be noted that fourth doped region 70 may be formed of an N type semiconductor material thereby raising the threshold voltage between first and second doped regions 66 and 68.

The prior art CMOS configuration 52 of FIG. 3 includes no capacitor therein. As a result, this circuit is susceptible to soft radiation errors as noted above. Further, because of the formation of polysilicon layer 62, both N channel transistor 16 and P channel transistor 14 have the same thickness of gate insulator 60 between the gates and channels for each transistor. It should also be noted that first and second diffused regions 56 and 58 are not self-aligned with first doped region 64 which as a gate conductor thereto.

FIGS. 4a–4c and FIGS. 5a–5b illustrate cross-sectional views of the fabrication of the transistor cell 80 of the present invention. It is again to be noted that while only half of the transistor cell is illustrated, an identical half may be made contemporaneously therewith and connected in order to complete the latch as shown in FIG. 1.

Figure 4A:
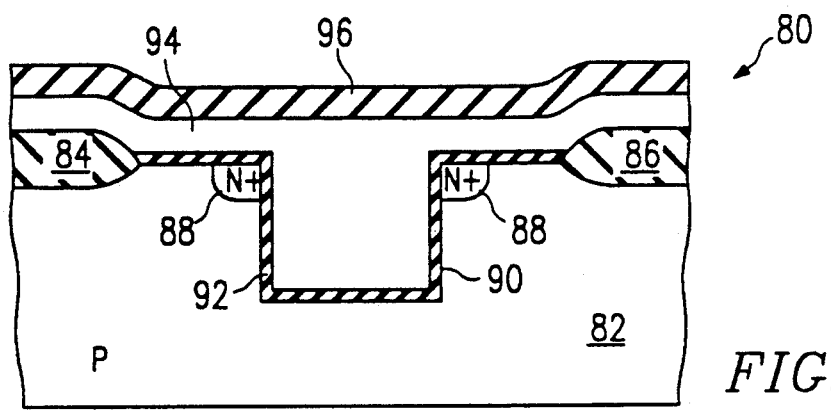
FIG. 4a illustrates a cross-sectional view of an initial processing stage for the preferred stacked configuration of the present invention.

FIG. 4a illustrates a cross-sectional view of an initial stage of the fabrication of transistor cell 80 of the present invention. A semiconductor substrate 82 has field insulating regions 84 and 86 formed thereon. Typically, semiconductor substrate 82 comprises a P type semiconductor material such as a P type wafer. Field insulating regions 84 and 86 are field oxide regions used to isolate the device formed therebetween from adjacent devices. After the formation of field insulating regions 84 and 86, an implantation process is utilized to form a diffused region 88 between field insulating regions 84 and 86. In the preferred embodiment, diffused region 88 is formed with an N type semiconductor dopant source. Trench 90 is formed within semiconductor substrate 82 and through diffused region 88 such that diffused region 88 will thereafter remain adjacent trench 90. Trench 90 may be formed in accordance with known processes in the semiconductor fabrication art such as a reactive ion etch. Trench 90 is typically on the order of 1.0 $\mu$m in width. The depth of trench 90 is selected in accordance with the desired channel length necessary for the transistor to be formed associated with trench 90.

An insulating layer 92 on the order of 120 angstroms in thickness is formed within trench 90 and extends outwardly therefrom adjacent semiconductor substrate 82. Typically, insulating layer 92 may be formed by oxidizing semiconductor substrate 82. A semiconductor layer 94 is formed adjacent insulating layer 92 and extends within trench 90. Semiconductor layer 94 typically comprises polysilicon and has a thickness sufficient such that it fills up the entirety of trench 90. A typical thickness of semiconductor layer 94 will be on the order of 0.3 $\mu$m. In the preferred embodiment, semiconductor layer 94 has a dopant concentration on the order of $10^{21}/cm^3$. An insulating layer 96 is formed overlying semiconductor layer 94. Insulating layer 96 is a TEOS oxide in the preferred embodiment with a thickness greater than the combined thickness of insulating layers 92 and 102 (see FIG. 4c). This thickness will adequately protect semiconductor layer 94 during subsequent processing steps.

Figure 4B:
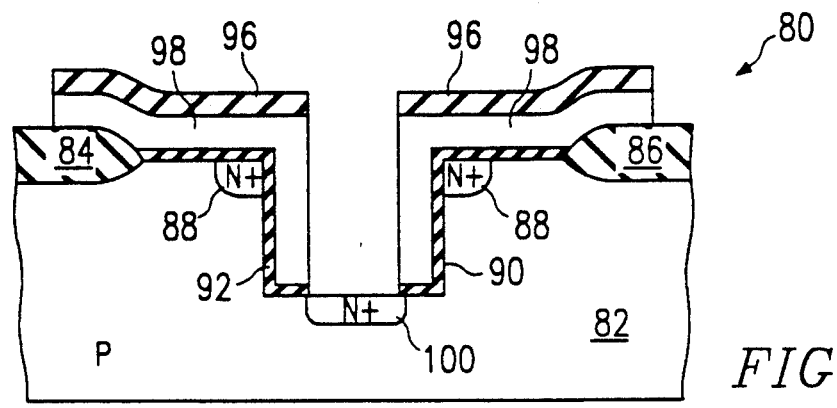
FIG. 4b illustrates a cross-sectional view of an intermediate stage in the fabrication of the stacked configuration of the present invention.

FIG. 4b illustrates a cross-sectional view of an intermediary stage of the transistor cell 80 of the present invention. The structure of FIG. 4a is patterned and etched such that a polysilicon region 98 remains along the sidewalls of trench 90 and extends outwardly therefrom adjacent semiconductor substrate 82. While FIG. 4b illustrates a cross-sectional view of transistor cell 80, it is to be understood that semiconductor region 98 will be formed in a continuous fashion around the periphery of trench 90 and in contact with insulating layer 92. A diffused region 100 is formed within semiconductor substrate 82 at the bottom of trench 90. Diffused region 100 will be doped in a fashion similar to that of diffused region 88 so that a transistor effect may be realized therebetween. Thus, the transistor channel is adjacent the trench between diffused regions 88 and 100. In the preferred embodiment, diffused region 100 is doped at a dopant concentration on the order of $10^{21}/cm^3$. After diffused region 100 is formed, a portion of insulating layer 92 along the bottom of trench 90 is removed. A plasma etch may be used for this process. The etch will also cause insulating layer 96 to be reduced in thickness by the same depth of the portion of insulating layer 92 removed from the bottom of trench 90.

Figure 4C:
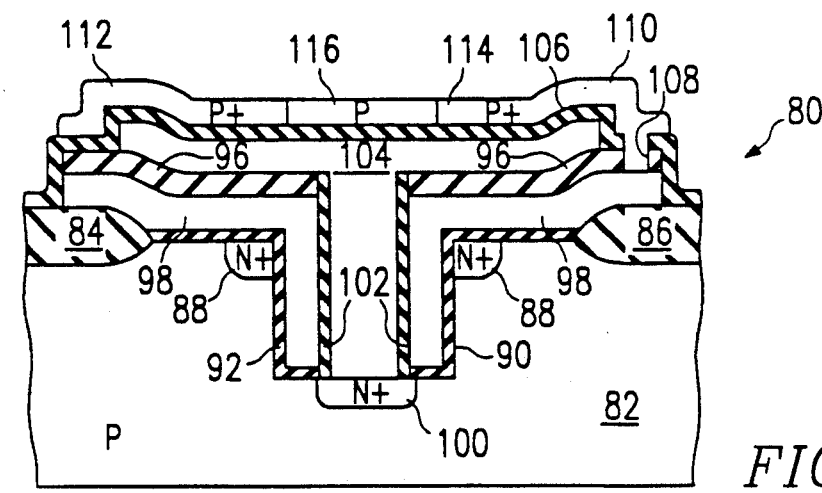
FIG. 4c illustrates a cross-sectional view of the interconnected cross-coupled CMOS transistors of the present invention.

FIG. 4c illustrates a cross-sectional view of a further processing stage of transistor cell 80 of the present invention. A thin insulating layer 102 is formed adjacent semiconductor region 98 and generally within trench 90. The thickness of insulating layer 102 is typically on the order of 150 angstroms but may be varied in order to achieve a desired capacitance as will be discussed below. Insulating layer 102 may be formed by depositing a thin oxide layer within trench 80 along the exposed portions of semiconductor region 98. In this instance, a plasma etch will again be necessary in order to remove the portion of insulating layer which lies along the bottom of trench 90. The plasma etch to remove this portion will not attack semiconductor region 98 because of the overlying TEOS insulating layer 96.

A semiconductor layer 104 is deposited adjacent insulating layer 96 and will further fill the remaining area within trench 90 adjacent insulating layer 102. An in situ process may be used for the deposition of semiconductor layer 104. Further, semiconductor layer 104 is typically on the order of 0.3 $\mu$m in thickness and on the order of $10^{20}/cm^3$ in dopant concentration. Semiconductor layer 104 is patterned and etched and covered by an insulating layer 106. Insulating layer 106 is commonly on the order of 200-250 angstroms in thickness and comprises an oxide material. A connection hole 108 is etched through insulating layers 106 and 96 such that contact may be made to semiconductor region 98. A semiconductor layer 110 is formed adjacent insulating layer 106 and fills connection hole 108, thereby making contact to semiconductor region 98. Semiconductor layer 110 is then masked and appropriately doped to include therein a first and second doped region 112 and 114. Doped regions 112 and 114 are of a dopant concentration on the order of $10^{21}/cm^3$ and are of the same conductivity type. In the preferred embodiment, a P type dopant source is utilized for doping doped regions 112 and 114. A channel region 116 is formed between doped regions 112 and 114. Channel region 116 may be doped with either a P or N type dopant source. However, in order to obtain a lesser threshold between doped regions 112 and 114, channel region 116 may be doped with the same type of semiconductor dopant as doped regions 112 and 114. The dopant concentration for channel region 116 is on the order of $5(10)^{16}$ to $1(10)^{17}/cm^3$.

The structure depicted in FIG. 4c represents a general cross-sectional view of the schematic view shown in FIG. 2 but without the connections to either the voltage signals or voltage sources shown therein. N channel transistor 16 is realized by use of a trench transistor using diffused regions 88 and 100 as source/drains therefor. Further, semiconductor region 98 functions as the gate for the N channel transistor, thus being operable to cause current flow between diffused regions 88 and 100. P channel transistor 14 is realized through the stacked transistor having a channel region 116 between doped regions 112 and 114. Semiconductor layer 104 functions as the gate for the P channel transistor. The extension of semiconductor layer 104 within trench 90 to contact diffused region 100 is the structural equivalent of connecting gate 38 of P channel transistor 38 to second source/drain 30 of N channel transistor 16.

The combination of semiconductor layer 104 and semiconductor region 98, having a dielectric (insulating layers 96 and 102) therebetween, functions as capacitor 50 for the configuration. Accordingly, it may be appreciated that the thicknesses of insulating layers 96 and 102 may be selected to achieve a desired capacitance between semiconductor region 98 and semiconductor layer 104. Thus, FIG. 4c illustrates a transistor cell having a trench transistor, a stacked transistor and a stacked capacitive element therein. It is also to be understood that the transistor semiconductor types may be reversed. In other words, the trench transistor may be a P type transistor while the stacked transistor is an N type transistor.

As illustrated in FIG. 2, there are also required connections to voltage signals and supplies. Accordingly, doped region 112 is connected to $V_{cc}$ while diffused region 88 is connected to ground. The input signal, $V_{IN}$, may be connected to either diffused region 100 or semiconductor layer 104. The output signal, $V_{OUT}$, may be realized by contacting either doped region 106 or semiconductor region 98.

Figure 5A:
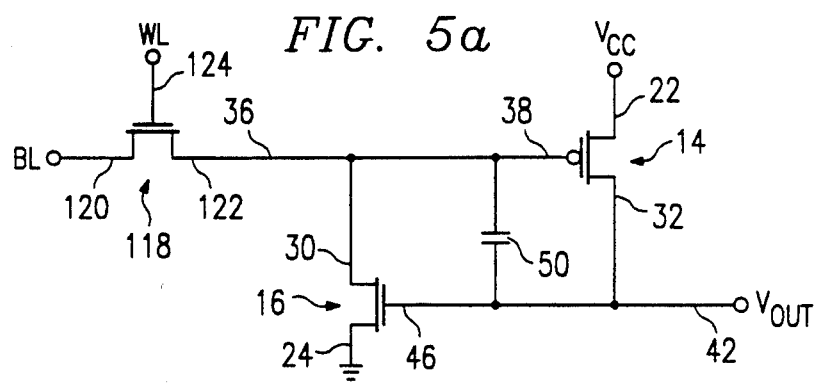
FIG. 5a illustrates the schematic of FIG. 2 having an enabling transistor added thereto.

FIG. 5a illustrates a schematic view of the transistor cell of the present invention having an enabling transistor 118 added thereto. Enabling transistor 118 has a first source/drain 120 connected to a bitline (denoted "BL") of the circuit containing the cell and its second source/drain 122 connected to gate 38 of P channel transistor 14. The gate 124 of enabling transistor 118 is connected to a wordline (denoted "WL") of the circuit.

The addition of enabling transistor 118 affects the operation of the circuit of FIG. 5a as follows. An enabling signal may be placed at the wordline, and thus, at gate 124 of enabling transistor 118. The enabling signal will cause the transistor to conduct between its first and second source/drains 120 and 122. Accordingly, if an input signal is placed on the bitline to source/drain 120 and an activating signal is placed at gate 124, then the input signal will pass through enabling transistor 118 to the remainder of the circuit shown. It is also to be noted that a similar enabling transistor may be placed at the output node 42 in FIG. 2 such that the same enabling feature may be used to read the output signal of the transistor cell.

Figure 5B:
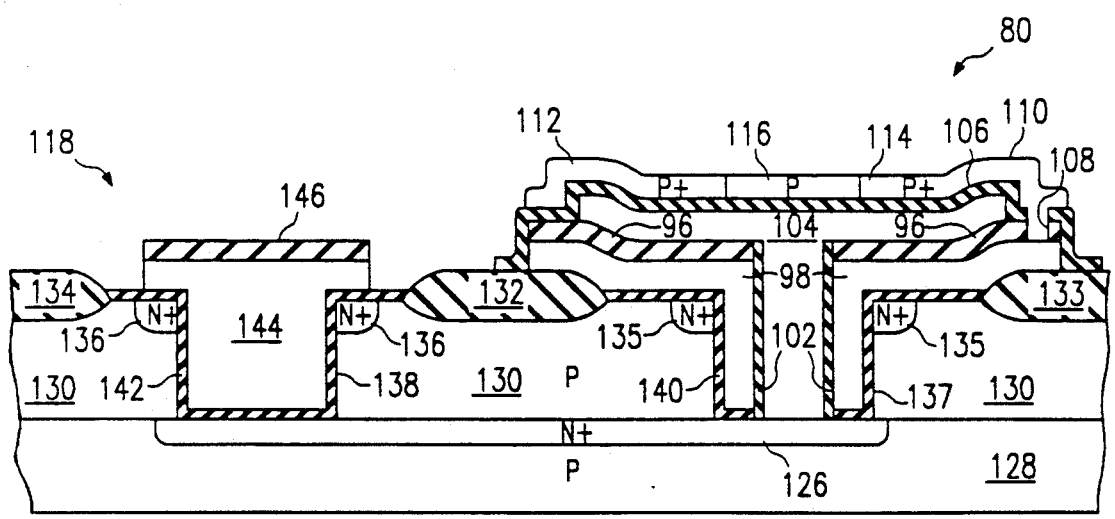
FIG. 5b illustrates a cross-sectional view of the stacked configuration of the present invention having an enabling transistor added thereto.

FIG. 5b illustrates a cross-sectional view of the transistor cell 80 of the present invention having an enabling transistor 118 added thereto. Transistor cell 80 of FIG. 5b is constructed generally in accordance with the same principles as discussed in reference to FIG. 4c. However, in order to connect enabling transistor 118 to transistor cell 80, slight modifications in the steps mentioned above may be made as noted below. For optimal efficiency, transistor cell 80 and enabling transistor 118 may be constructed simultaneously.

In constructing the components of FIG. 5b, a diffused region 126 is formed within a semiconductor substrate 128. Typically, diffused region 126 is doped with an N type dopant source on the order of $10^{21}/cm^3$, while semiconductor substrate 128 is of a P type material. A semiconductor layer 130 is placed adjacent semiconductor substrate 128. Semiconductor layer 130 is of the same semiconductor type as semiconductor substrate 128. Field insulating regions 132, 133 and 134 are formed at the surface of semiconductor layer 130. Diffused regions 135 and 136 are formed within semiconductor layer 130. This process may be effected by appropriately masking semiconductor layer 130 and implanting areas of dopant concentration on the order of $10^{21}/cm^3$. In the preferred embodiment, both diffused regions 135 and 136 comprise N type dopants. Two trenches 137 and 138 are then formed from the surface of semiconductor layer 130 to a depth in order to contact diffused region 126. Insulating layer 140 is formed within trench 137 and extends outwardly therefrom toward field insulating regions 132 and 133. Similarly, insulating layer 142 is formed within trench 138 and extends outwardly therefrom toward field insulating regions 134 and 132. Insulating layers 140 and 142 may be formed by growing an oxide along the exposed semiconductor area on the order of 120 angstroms in thickness. The remainder of transistor cell 80 may be constructed in accordance with the steps mentioned above in connection with FIGS. 4a–c. Accordingly, the remainder of the reference numerals from FIG. 4c have been incorporated into the transistor cell 80 of FIG. 5b. Enabling transistor 118 is completed by depositing a semiconductor region 144 within trench 137 and extending outwardly therefrom. The deposition of semiconductor region 144 may be accomplished by in situ deposition of doped polysilicon having a dopant concentration on the order of $10^{20}/cm^3$. An insulating layer 146 is formed overlying semiconductor region 144.

From FIGS. 5a and 5b, it may appreciated that semiconductor region 144 functions as gate 124 for enabling transistor 118. Diffused region 136 is operable as first source/drain 120 while diffused region 126 is operable as second source/drain 122. Thus, the construction depicted in FIG. 5b realizes a connection between second source/drain 122 and gate 38 of P channel transistor 14 by extending diffused region 126 to contact second semiconductor layer 104 of transistor cell 80.

The present invention therefore provides a method and structure for realizing a transistor cell having crosscoupled capacitors therein. The capacitive elements maintain the state of the cell during periods of exposure to soft radiation. The use of a stacked P channel transistor overlying a trench N channel transistor gives rise to minimal lateral-sized dimensions and therefore, provides for maximum packing density. The use of independent gate oxides for the different transistors within the circuit allows for varying threshold voltages for each of the transistors and improves gate oxide integrity associated with the transistors.

Although the present invention has been described in detail, it should be understood that various changes, substitutions and alterations can be made herein without departing from the spirit and scope of the invention as defined by the appended claims.

What is claimed is:

1. An integrated device comprising:
   a semiconductive substrate having a first trench formed therein and having a first conductivity type;
   first and second doped regions formed in said substrate each adjacent to said trench and separated by a first channel region;
   a first insulating layer formed on the walls of said first trench;
   a first gate formed on the walls of said trench over said insulating layer, said gate controlling current in said first channel region;
   a second insulating layer formed on the walls of said trench and over said first gate;
   a second gate formed on the walls of said trench and over said second insulating layer, said second gate and said first gate being capacitively coupled and said second gate being conductively connected to said second doped region;
   a third insulating layer formed on said second gate; and
   a semiconductive layer formed on said third insulating layer, a third and fourth doped region formed in said semiconductive layer, said third and fourth doped regions being separated by a second channel region and said second gate controlling current in said second channel region.

2. An integrated device as in claim 1 wherein said substrate comprises crystalline silicon.

3. An integrated device as in claim 1 wherein said semiconductive layer comprises polycrystalline silicon.

4. An integrated device as in claim 1 wherein said third doped region is conductively connected to said first gate.

5. An integrated device as in claim 5 further comprising:
- a second trench formed in said substrate, said second doped region extending to said second trench from said first trench;
- a fifth doped region formed in said substrate adjacent to said second trench, said fifth doped region being separated from said second doped region by a third channel region; and
- a gate formed in said second trench controlling current in said third channel region.

6. An integrated device which includes a pair of transistor cells, said integrated device comprising:
- a semiconductive of a first conductivity type, said semiconductor being the substrate for and defining a first trench for each one of said pair of transistor cells each of said transistor cells including:
- first and second doped regions formed in said substrate, each adjacent to said trench and separated by a first channel region;
- a first insulating layer formed on the walls of said first trench;
- a first gate formed in said trench and over said insulating layer, said gate controlling current in said first channel region;
- a second insulating layer formed on the walls of said trench and over said first gate;
- a second gate formed on the walls of said trench and over said second insulating layer, said second gate and said first gate being capacitively coupled and said second gate being conductively connected to said second doped region;
- a third insulating layer formed on said second gate;
- a semiconductive layer formed on said third insulating layer, a third and fourth doped region formed in said semiconductive layer, said third and fourth doped regions being separated by a second channel region and said second gate controlling current in said second channel region; and
- said first gates of said pair of cells conductively connected to said second gates of the other one of said pair of cells.

7. An integrated device as in claim 6 wherein for each of said transistor cells, said third doped region is conductively connected to said first gate.

8. An integrated device as in claim 6 wherein each one of said pair of transistor cells further comprises:
- a second trench formed in said substrate, said second doped region extending to said second trench from said first trench;
- a fifth doped region formed in said substrate adjacent to said second trench, said fifth doped region being separated from said second doped region by a third channel region; and
- a gate formed in said second trench controlling current in said third channel region.

9. An integrated device as in claim 6 wherein said substrate comprises crystalline silicon.

10. An integrated device as in claim 6 wherein said semiconductive layer comprises polycrystalline silicon.

11. An integrated device as in claim 6 wherein said third doped region of at least one of said pair of transistor cells is conductively connected to said first gate.

* * * * *